US010418991B2

(12) United States Patent
Tangwancharoen et al.

(10) Patent No.: US 10,418,991 B2
(45) Date of Patent: Sep. 17, 2019

(54) GATING GRID DRIVER FOR GAS RADIATION DETECTORS

(71) Applicant: Board of Trustees of Michigan State University, East Lansing, MI (US)

(72) Inventors: Suwat Tangwancharoen, Bangkok (TH); ManYee Betty Tsang, East Lansing, MI (US); William G. Lynch, East Lansing, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 160 days.

(21) Appl. No.: 15/814,908

(22) Filed: Nov. 16, 2017

(65) Prior Publication Data

US 2018/0145687 A1 May 24, 2018

Related U.S. Application Data

(60) Provisional application No. 62/422,744, filed on Nov. 16, 2016.

(51) Int. Cl.
*H03K 17/687* (2006.01)
*G01T 1/185* (2006.01)
*G01T 1/175* (2006.01)
*G01T 1/17* (2006.01)

(52) U.S. Cl.
CPC .......... *H03K 17/6872* (2013.01); *G01T 1/17* (2013.01); *G01T 1/175* (2013.01); *G01T 1/185* (2013.01)

(58) Field of Classification Search
CPC .......... G01T 1/17; G01T 1/175; G01T 1/185; H03K 17/6872
See application file for complete search history.

(56) References Cited

U.S. PATENT DOCUMENTS

| | | | | |
|---|---|---|---|---|
| 6,300,764 B1 * | 10/2001 | Kelley | ............... | G01R 31/2829 102/217 |
| 2011/0156610 A1 * | 6/2011 | Ostrovsky | ............ | H05B 39/083 315/291 |
| 2014/0077792 A1 * | 3/2014 | Equihua | ........... | H03K 17/04123 323/355 |
| 2017/0331270 A1 * | 11/2017 | Mattos | ................... | H02H 3/087 |

* cited by examiner

*Primary Examiner* — Alfonso Perez Borroto
*Assistant Examiner* — Esayas G Yeshaw
(74) *Attorney, Agent, or Firm* — Harness, Dickey & Pierce, PLC

(57) ABSTRACT

A gating grid driver for use with radiation detectors, such as time projection chambers and other similar devices that require a gating grid that operates in a bipolar mode with different electrostatic potentials on alternating wires. To open such gating grids, the driver shorts the alternate wires to a common voltage $V_a$. Later, this driver closes the grid by restoring the voltage differences in the adjacent wires. By connecting the driver circuit to the gating grid via low impedance transmission lines, the driver circuit opens the gating grid in 0.35 µs, minimizing the lost drift length associated with this opening time. The circuit consists of 2 pairs of N- and P-MOSFET switches and includes two adjustable capacitors and resistors that can be used to adjust the opening time, and shift the balance of positive and negative charge for individual radiation detector.

17 Claims, 11 Drawing Sheets

GATING GRID DRIVER FOR GAS RADIATION DETECTORS

CROSS-REFERENCE TO RELATED APPLICATIONS

This application claims the benefit of U.S. Provisional Application No. 62/422,744, filed on Nov. 16, 2016. The entire disclosure of the above application is incorporated herein by reference.

GOVERNMENT LICENSE RIGHTS

This invention was made with government support under Grant No. DE-SC0004835 awarded by the U.S. Department of Energy; and Grant No. PHY 1102511 awarded by the National Science Foundation. The government has certain rights in the invention.

FIELD OF THE DISCLOSURE

The disclosure relates generally to equipment and techniques for measuring charged particles emitted in nuclear collisions using radiation detectors such as time projection chambers. More particularly, the disclosure relates to a fast-acting electronic circuit for controlling a gating grid in a time projection chamber.

BACKGROUND

Since its invention, radiation detectors such as Time Projection Chambers (TPCs) have been used successfully in many experiments to measure charged particles emitted in nuclear collisions, using devices such as the EOS TPC, the STAR detector at Relativistic Heavy Ion Collider (RHIC) and the ALICE detector at the Large Hadron Collider (LHC). For purposes of illustrating how a TPC operates, this disclosure will feature the SAMURAI Pion-Reconstruction Ion-Tracker Time Projection Chamber (SπRIT-TPC), designed for use with the SAMURAI spectrometer at the Radioactive Isotope Beam Factory (RIBF) at RIKEN, Japan. Those of skill in the art will recognize that the techniques disclosed here can be utilized with other gas radiation detectors, other similar devices and other TPC configurations.

The operation principle of a TPC and its wire planes are illustrated in FIGS. 1 and 2. FIG. 1 shows a TPC field cage, which is filled with counter gas. Electrodes on the walls of the field cage provide a uniform electric gradient potential within the cage. The TPC is normally placed inside a uniform magnetic field, which is parallel to the electric field. The magnetic field allows the determination of the momenta of charged particles and has the ancillary benefit of improving the resolutions of particle tracks by limiting the diffusion of electrons in directions perpendicular to the magnetic field.

When a violent heavy-ion reaction occurs, charged particles are produced in the target, which is located just outside of the upstream window of the field cage for the SπRIT TPC. These charged particles enter the field cage through the window and ionize the detector gas, liberating secondary electrons along the tracks of these particles. The secondary electrons drift along the anti-parallel electric and magnetic fields towards a set of three wire planes located at the top of the field cage. The wire planes are not visible in FIG. 1, but their functions are illustrated schematically in FIG. 2, in which the wires are drawn larger than scale to make them more visible. The 3 layers of wire planes are mounted just below a pad plane tiled with pads. This pad plane forms the upper boundary of the field cage volume, and the bottom boundary of the field cage is the cathode. By measuring the arrival time and the induced charge of the avalanched electrons produced around the anode wires, the TPC provides an accurate 3-D reconstruction of these tracks in the gas from which the particle momenta and the energy losses for each of the charged nuclear reaction products in the counter gas can be deduced.

In many TPC applications, there can be charged particles that enter the field cage that are not of scientific interest. In the SπRIT TPC experiments, these include beam particles that do not interact with the target or large projectile residues from very peripheral collisions. It is important to restrict gas multiplication of the ionization of such undesired particles. Amplification of undesired particles will accelerate the aging process of the anode wires by creating negatively charged polymers from the hydrocarbon components or impurities in the detector gas either during the primary ionization or during the avalanche. If the deposition of such polymers on the anode wires is not controlled, the effective anode wire diameters can increase with time due to the deposit, reducing the gas gain and deteriorating the performance of the TPC.

SUMMARY

Throughout this specification the TPC is used as the representative radiation detector. While demonstrating the invention within the example of a TPC, the invention is not limited to TPC radiation detectors but may apply to other radiation detector configurations and other devices as well. When utilizing the TPC, it would be desirable if the gating grid could be opened and closed extremely rapidly, in response to the occurrence of interesting events (i.e., events under study). As will be more fully explained herein, that is the function of the disclosed gating grid driver circuit.

The gating driver circuit connects the wires of the gating grid to its driver via low impedance transmission lines. When the gating grid is open (FIG. 2b), all wires have the same voltage allowing secondary electrons produced in the ionization of the detector gas molecules to pass through to the anode wires. When the grid is closed (FIG. 2a), the wires have alternating higher and lower voltages causing the electrons to terminate at the more positive wires. Rapid opening of the gating grid is achieved by shorting the positive and negative wires to attain the average bias potential rapidly with N-type and P-type MOSFET switches. The closing time is then characterized by the RLC constant given by the resistance of the switches, the capacitance of the gating grid and the small inductance to the opening currents of the gating grid.

For clarity, we refer to the set of wires with more negative voltages when the gating is open as negative gating grid and the remaining wires as positive gating grid. In accordance with one aspect, the disclosed gating circuit is configured for respectively driving the positive and negative gating grids of a time projection chamber. The circuit includes a first electronically actuated switch having a first terminal adapted to be coupled to the positive gating grid and a second terminal adapted to be coupled to the negative gating grid. These first and second electronically actuated switches are preferably implemented using tandem pairs of MOSFET transistors, each pair including an N-MOSFET and a P-MOSFET. The switching circuits thus support bipolar switching of the positive and negative grids.

The first electronically actuated switch has a first switching state in which the positive and negative gating grids are decoupled from one another, and a second switching state in which the positive and negative gating grids are shorted together. When shorted together, the positive and negative gating grids are allowed to rapidly seek the same voltage level.

The gating circuit also includes a voltage supply circuit that comprises a first voltage source producing a predetermined voltage above a predetermined reference voltage, and a second voltage source producing a predetermined voltage below the predetermined reference voltage.

The circuit further includes a second electronically actuated switch having a third terminal adapted to be coupled to the positive gating grid and a fourth terminal adapted to be coupled to the negative gating grid and being coupled to the voltage supply circuit.

The second electronically actuated switch has a third switching state in which the positive and negative gating grids are decoupled from the voltage supply circuit and a fourth switching state in which the positive grid is coupled to the first voltage source and in which the negative grid is coupled to the second voltage source.

The first and second electronically actuated switches are preferably controlled by a controller that operates to selectively:
(a) place the first electronically actuated switch in the second state while concurrently placing the second electronically actuated switch in the third state, to open the gating grids of the time projection chamber; and
(b) place the first electronically actuated switch in the first state and placing the second electronically actuated switch in the fourth state, to close the gating grids of the time projection chamber.

In this way, the gating grid can be very rapidly switched between the open state and the closed state, allowing precise control over the nuclear collision experiments.

According to another aspect, disclosed is a gating device for radiation detectors. A bipolar gating grid defined by spaced apart wires defining alternating pairs of positive and negative charge carrying wires are coupled to a transmission line system. The transmission line system defines a first transmission line coupled to the positive charge carrying wires and a second transmission line coupled to the negative charge carrying wires.

The gating device further includes a controller circuit that supplies timing signals. The controller circuit can be implemented using discrete electronic devices or using a programmed processor with associated memory. Also included is a power supply responsive to the controller circuit and coupled through the transmission line system to the spaced apart wires and operable to apply positive and negative charges to the respective positive and negative charge carrying wires.

The gating device further includes a gating circuit responsive to the controller circuit and coupled through the transmission line system to the spaced apart wires and configured to short together the positive and negative charge carrying wires to substantially neutralize the positive and negative charges on the respective positive and negative charge carrying wires.

The gating circuit of the gating device may be implemented using a first tandem pair of MOSFET transistors coupled to the first transmission line though a first impedance coupling and a second tandem pair of MOSFET transistors coupled to the second transmission line through a second impedance coupling. The first and second impedance couplings, which may each be implemented as a resistor and a capacitor, are each tuned to substantially match the impedances of the respective first and second transmission lines taking into account the inherent reactance of the first and second tandem pairs of MOSFET transistors.

The first and second transmission lines of the gating circuit may each be configured to exhibit an impedance of nominally 4 ohms.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

The drawings described herein are for illustrative purposes only of selected embodiments and not all possible implementations, and are not intended to limit the scope of the present disclosure.

FIG. 2a depicts the electron field lines when the gate is closed and FIG. 2b depicts the electron field lines when the gate is open. Only the field lines directly under the anode wires are shown.

FIG. 6b having the following capacitance and resistance values: Cp=100 pF, Cn=100 pF, Rp=0.95 ohms, Rn=1.05 ohms;

DESCRIPTION OF THE PREFERRED EMBODIMENT

Figure 3A:
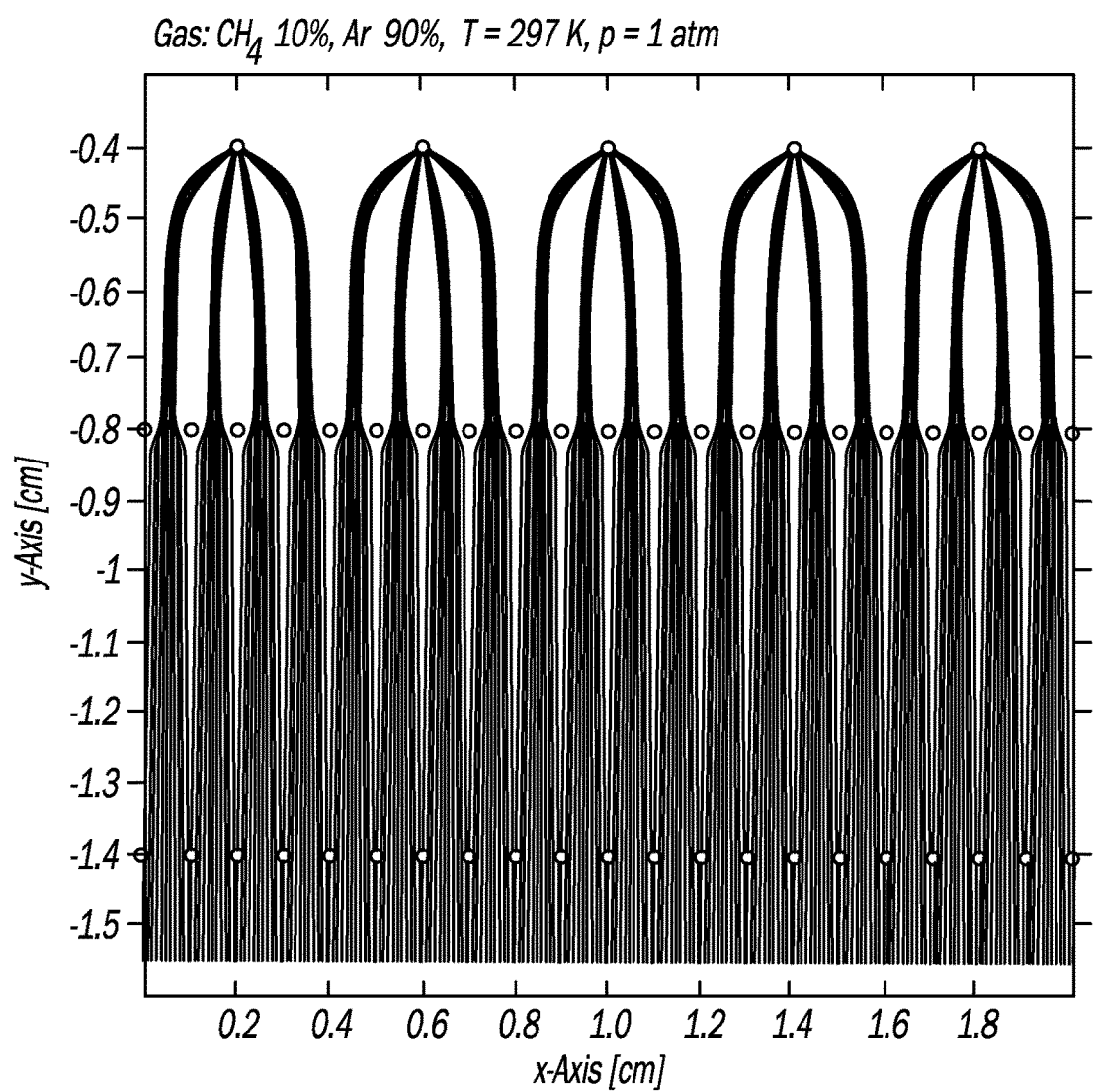
FIGS. 3a and 3b (collectively referred to as FIG. 3) are graphs showing the performance of the gating grid in greater detail using Garfield calculations, FIG. 3a showing the electric drift lines near the wire plane for the configuration with the gating grid open and FIG. 3b providing an expanded view showing the electrons terminating at the positive wires of the gating grid (located at y=−1.4 cm)
Figure 3B:
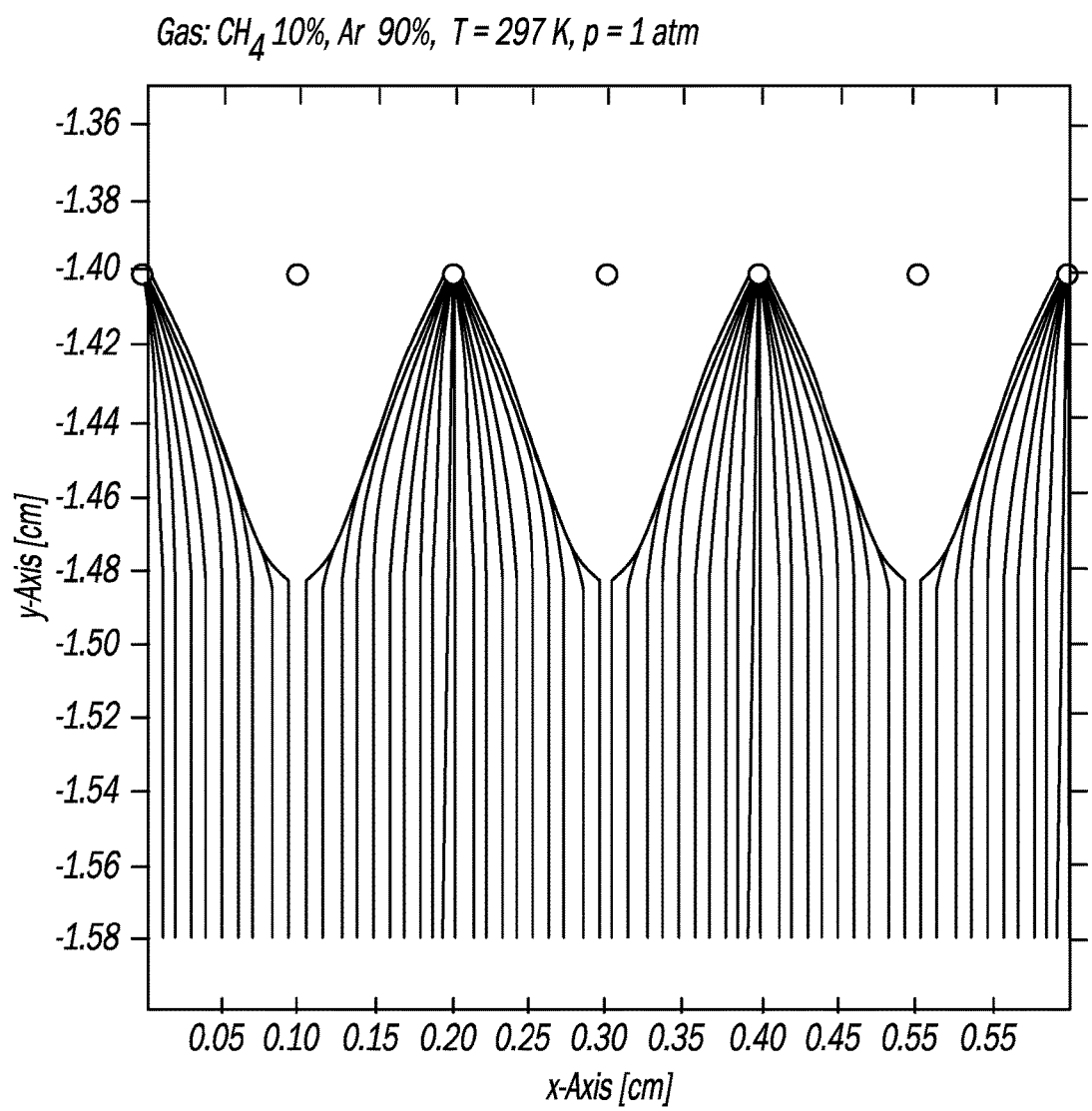

To suppress the detection of unwanted particles, it is essential that the gating grid which is the wire plane closest to the drift region, remains "closed" to electrons ionized by the non-interacting beam and other uninteresting events. In this closed state, as illustrated in FIG. 3a, the gating grid captures the secondary electrons produced in the field cage volume. When the external trigger detection system indicates the occurrence of an interesting event, the gating grid is opened as illustrated in FIG. 3b. Then, the secondary electrons pass through the gating grid, and then through the ground wire plane, to reach the anode wires located between the ground plane and the pad plane. These secondary electrons will then create an avalanche in the high electric field region of the anode wires, which multiplies the electrons by a typical gas gain of about 2000 depending on the anode voltage.

Figure 1:
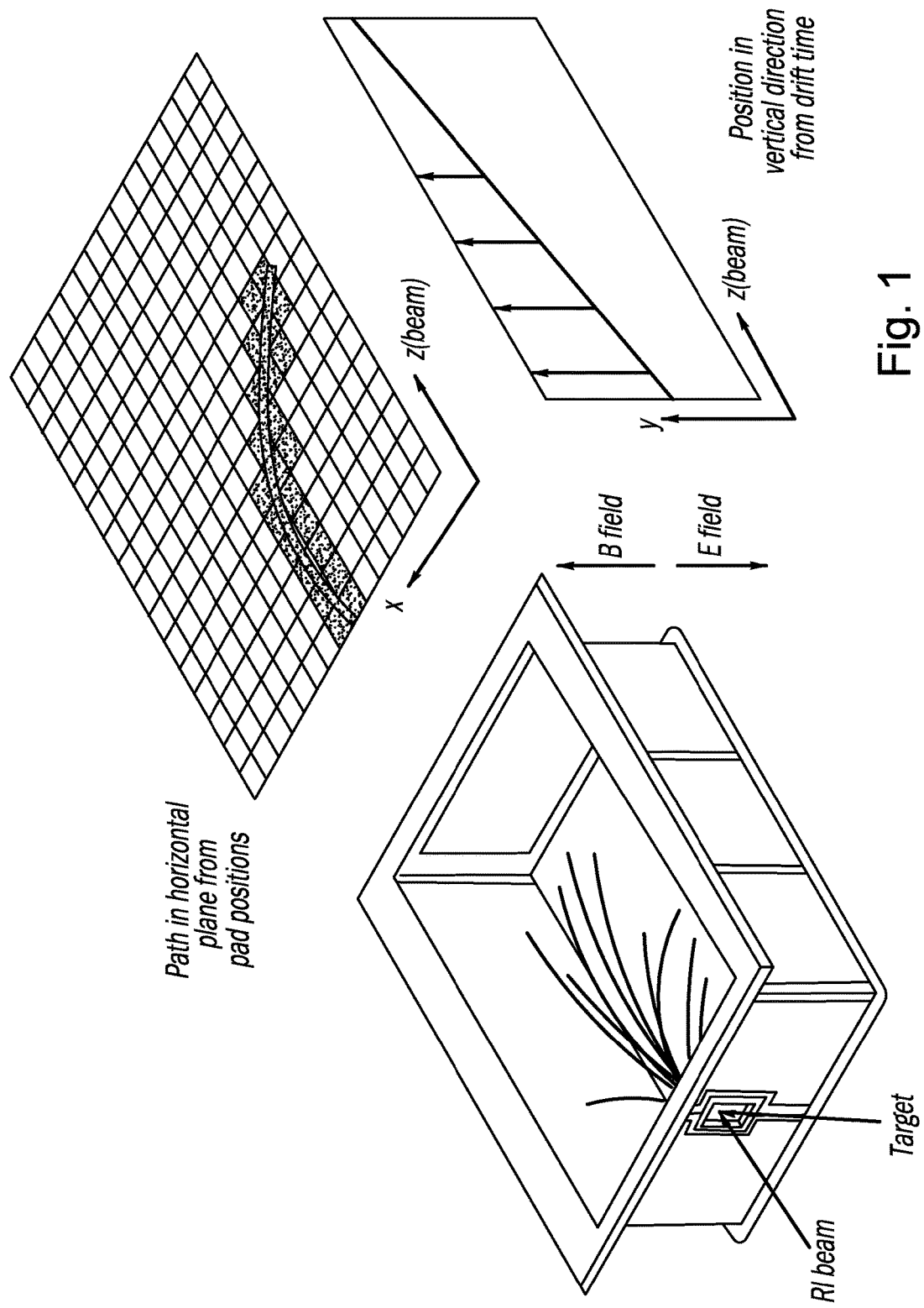
FIG. 1 illustrates an exemplary time projection chamber with field cage, useful in understanding the disclosed gating grid driver.
Figure 2A:
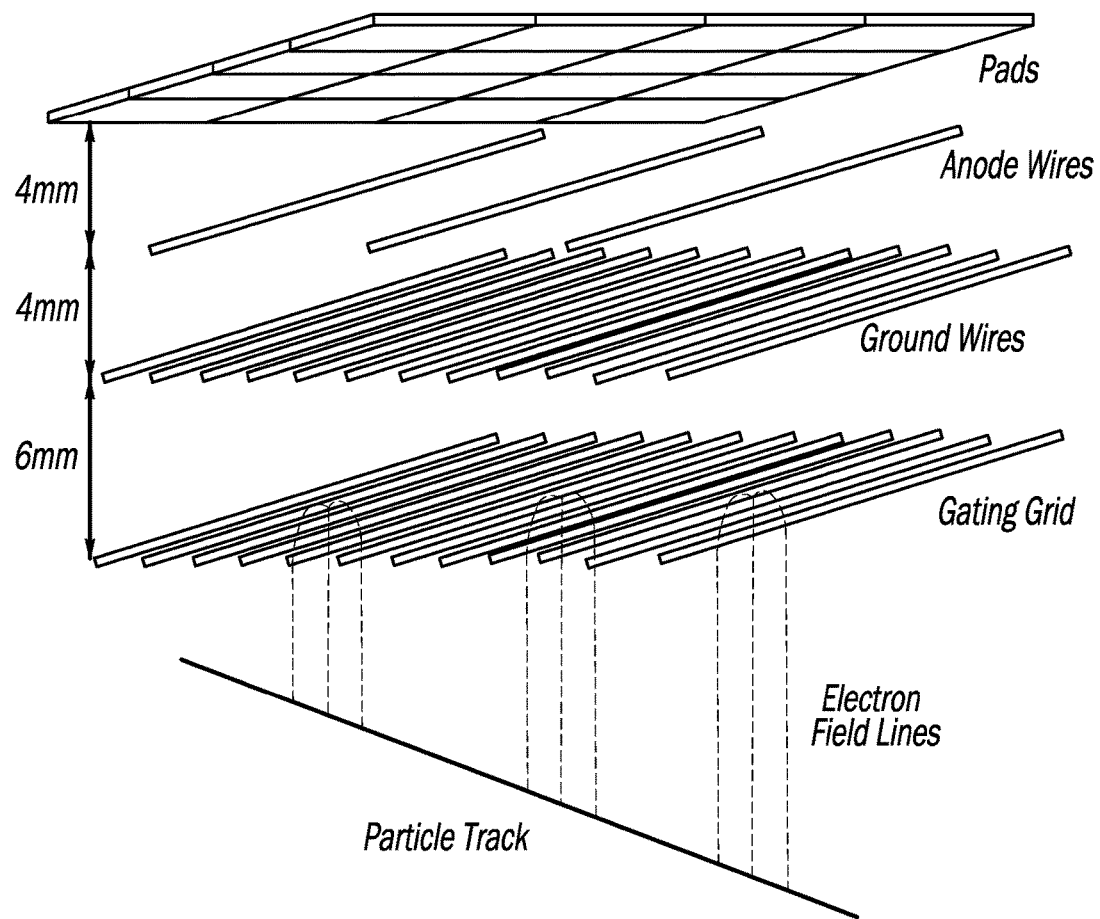
FIGS. 2a and 2b (collectively referred to as FIG. 2) comprise an exploded perspective view of the gating grid, ground wires, anode wires and detection pads schematically.
Figure 2B:
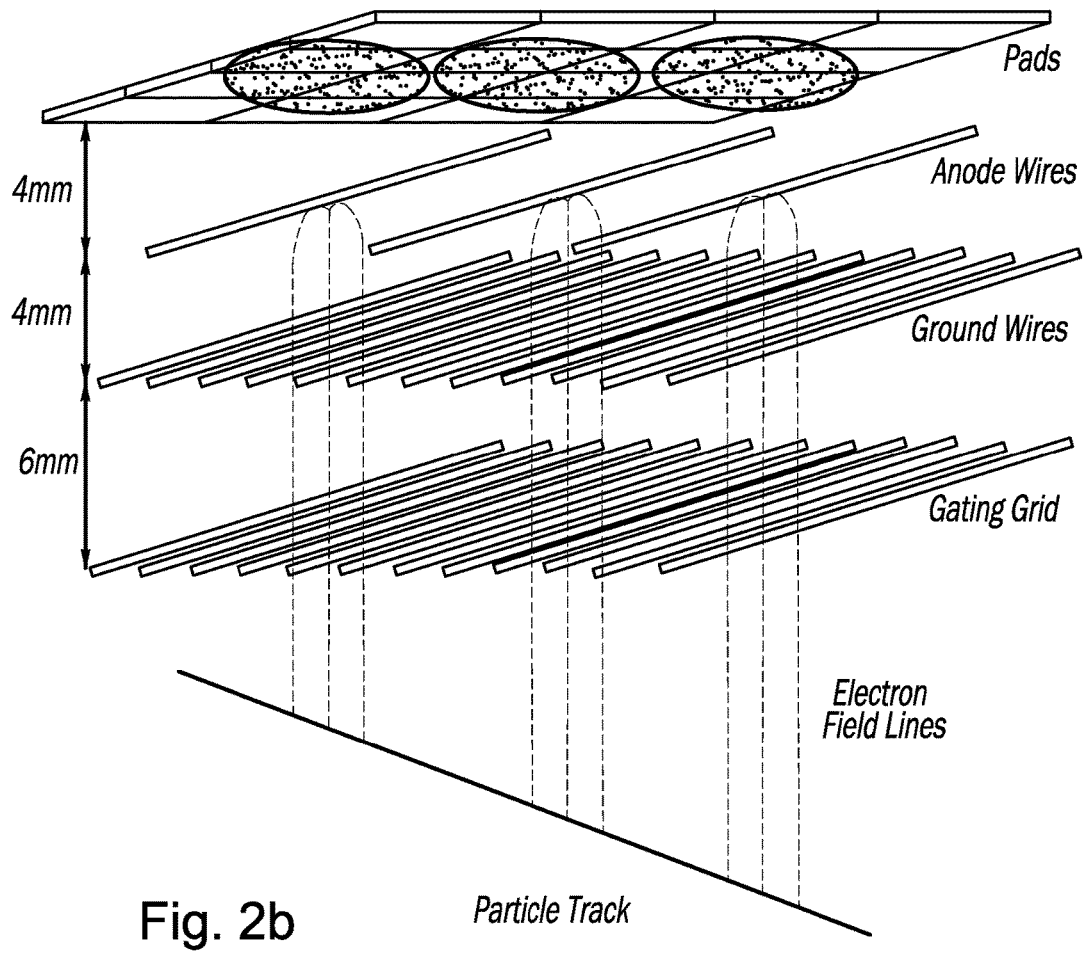

This avalanche also produces positive ions, whose motions away from the anode wires generates image currents on the pad plane as illustrated in FIG. 2b. These currents are amplified by the TPC electronics located above the pad plane and recorded. After their production, many of these positive ions travel through the ground plane towards the gating grid and the drift region of the TPC field cage. The drift velocities (on the order of cm/ms) of these positive ions are much slower than those of the electrons. It is important that the gating grid is closed to prevent these positive ions from passing through and accumulating in the drift region of the TPC field cage. Otherwise, the space charge of these positive ions could seriously distort the electric field of the field cage and degrade the spatial reconstruction of the tracks of the reaction products. To avoid this, the gating grid remains closed after all the electrons from an interesting event pass through it and only opens when triggered by the next interesting event.

I. Gating Grid

The electrostatic potentials on the gating grid wires are used to control the passage of electrons and positive ions and allow one to separate the drift volume of the TPC from the avalanche region. The gating grid serves three functions:
1. It prevents electrons from unwanted events from going into the avalanche region and being multiplied.
2. It prevents the back flow of the positive ions from the avalanche region into the drift volume.
3. It minimizes damage to the anode wires caused by the deposition of polymers on the wires.

The gating grid described here operates in a "bipolar" mode. When the gating grid is open, the potentials of all the wires are set to a common voltage, $V_a$, to match the electric field in the field cage and maximize the transmission of electrons. This makes the wires almost invisible to the drifting electrons, which pass through the gating grid plane and ground wire plane to the avalanche region. To close the gating grid in the bipolar mode, alternate wires are biased to potentials of $V_h=V_a+\Delta V_g$ and $V_l=V_a-\Delta V_g$. The gating grid has positive surface charge density on every other wire and negative surface charge density on the wires in between. When the voltages are suitably chosen so as to fully close the gating grid, the electron drift lines will terminate at the positive wires (connected to $V_h$), and the positive ions will terminate on the negative wires (connected to $V_l$). This effectively closes the gate and the secondary electrons and positive ions cannot pass through. The advantage of the bipolar mode is that the potential difference between open and closed configuration can be very small at the location of the pad plane. Thus the charge induced on the pads which constitutes as noise and interfere with signals, by the change of state in the gating grid can be small.

For illustration, we have modeled the electric field and the electron drift in the SPπRIT TPC with Version 9 of the Garfield drift chamber simulation program. The SπRIT TPC wire plane configuration is given in Table 1 and illustrated in FIG. 2.

Simulations were performed for a drift field of 131 V/cm in the field cage, corresponding to the maximum in the electron drift velocity for P10 gas, consisting of 90% Argon and 10% $CH_3$ by volume, at zero magnetic field. The behavior of drifting electrons and ions can be strongly influenced by the magnetic field. Its effect can be characterized by the parameter $\omega\tau$ where $\omega$ is a cyclotron frequency of the charged particle, $\omega=qB/m$, (electron or ion), $\tau$ is the mean time between collisions of the charged particle with the gas molecules, q is the charge and m is the mass of the charged particle. Due to the large masses of ions, $\omega\tau$ is very small $O(10^{-4})$ for ions, but can be greater than unity for electrons in certain gases and magnetic fields. Then larger corrections occur for the electrons in the parts of their trajectories where the electric field from a neighboring wire is perpendicular to magnetic field. The magnetic field reduces the mobility of electrons in directions towards the gating grid wires while adding components to the electron velocities in a direction parallel to the wire. Both effects diminish the number of electrons captured on the wire for a set of electrostatic potential when one increases the magnetic field, thereby increasing the difference voltage $\Delta V_g$ required to close the gate.

In this calculation, we assumed P10 counter gas, at a pressure of 101.3 kPa. The voltages of the gating grid were set to $V_a=-110$ V and $\Delta V_g=70$ V taking into account of larger $\Delta V_g$ required in the presence of 0.5 T magnetic field. FIG. 3a, shows the calculated electric drift lines in this region when the gating grid is open. All electrons pass from drift volume and continue between the wires of the gating grid and ground plane and terminate on the anode wire where avalanche occurs. In the coordinate system used in the figure, y=0 mm corresponds to the pad plane. For simplicity, FIG. 3a shows only subsection of the wire planes containing one anode wire, which is located at y=−0.4 cm and x=0.0 cm. Similarly, we show the 7 ground plane wires, located at y=−0.8 cm (x=0.0 to 0.4 cm) and the 7 gating grid wires, also located 0.6 cm (y=−1.4 cm) directly below the ground wires that occupy the section of the wire planes illustrated in this figure. The wires in both ground and gating grid planes are separated by a pitch of 1 mm as shown in FIG. 3 and Table 1.

TABLE 1

Wire-plane specifications for the SπRIT Time Projection Chamber
Wire-plane specifications

| Plane | Material | Diameter (μm) | Pitch (mm) | Distance to pad plane (mm) | No. of wires |
|---|---|---|---|---|---|
| Anode | Au-plated W | 20 | 4 | 4 | 364 |
| Ground | BeCu | 76 | 1 | 8 | 1456 |
| Gating | BeCu | 76 | 1 | 14 | 1456 |

One closes the gating grid by biasing the potentials on neighboring wires alternatively. FIG. 3b shows the electric drift lines when neighboring wires are biased to −180 V and −40 V, attracting electrons to the more positive wires at −40V and repelling them from the neighboring more negative wires biased to −180V. Neglecting scattering in the gas, nearly all electrons from the drift volume will follow the electric field drift lines shown in the figure, terminating at the nearest adjacent positively biased wire, effectively preventing significant transport of electrons through the gating grid to the anode wires. Small leakage may occur for trajectories when electron-ion scattering is taken in account.

As discussed below, this is typically counteracted by increasing the difference voltage $\Delta V_g$.

Many positive ions are produced by the avalanche at the anode wires and are repelled from the anode wires inducing an image of the avalanche in the pad plane. The ions are also attracted to the ground wire where most of them terminate. Those that pass through the ground wires will be attracted to the more negative wires biased to −180 V and will be repelled by the neighboring wires biased to the more positive potential of −40V. Nearly all ions will be stopped by the ground and gating grid wires.

II. Gating Grid Driver

The gating grid driver controls the transition between the closed and open states of the gating grid. After the event trigger is satisfied, ionized electrons will continue to drift into the grid and be captured, unless the gating grid driver opens the gating grid fully. The time elapsed between the trigger and fully opening the gate creates a "dead" region immediately below the gating grid of thickness $\Delta L_{dead} = v_{drift} \cdot \Delta t_{open}$. Electrons ionized in this region will be lost. For P10 gas $v_{drift} \approx 5.5$ cm/μs. To minimize $\Delta L_{dead}$, it is clearly important to design the driver to open the gating grid as quickly as possible.

To open the gating grid, one must reduce the voltages on half the wires by $\Delta V_g$ and increase the voltage on the remaining wires by $\Delta V_g$ in a very short time (~300 ns). This can potentially induce a large signal on the pads that could be comparable to the signal induced by a weakly ionizing particle such as a pion. To minimize such effects, a well-designed gating grid driver should change these charges at equal rates from both positive and negative sides of the wires so that the average potential of the gating grid remains constant minimizing the induced signal (noise) on the pads. The closure of the gating grid is achieved by reapplying the alternating potentials such that every second wire is biased more positively or more negatively by the difference voltage $\Delta V_g$.

A. Design of Gating Grid Driver Circuits

A conventional gating grid driver employs three high voltage power supplies, one at the common voltage ($V_a$), one at the higher voltage ($V_h$) and the third at lower voltage ($V_l$). The switching of voltages is typically accomplished with 4 switches, one pair for each alternate set of wires that switches the potential from the "closed" voltage ($V_h$ or $V_l$) to the average "open" voltage ($V_a$) and back to the "closed" voltage again.

In our design, the common voltage $V_a$ is set by shorting the more positive and more negative gating grid wires together to open the gate. Later after the electrons from the drift region are collected, the gating grid is closed by setting the voltages in alternate wires back to their original voltage of $V_h$ and $V_l$. The key challenge is to open the gate rapidly without having the average voltage of the two side of the gating grid deviating significantly from the correct value $V_a$. Ideally, the gating grid would open instantaneously when triggered. Since this is not possible, we aim to design and tune the driver circuit to open the gating grid in about 300 ns. Since it is not necessary to close the gating grid quickly, we design the gating grid to be closed in about 3 μs.

B. MOSFET Switches

The gating grid driver uses two pairs of N-MOSFET and P-MOSFET switches. The N- and P-type MOSFET switches work in tandem and are controlled by opposite polarity TTL signals. N-MOSFET switch is controlled by a positive TTL signal while P-MOSFET switch is controlled by a negative TTL signal. The advantage of using a MOSFET switch is that when the switch is closed, the internal resistance is lower compared to other types of switches. This helps in allowing one to tune the resistance across the switches to a lower total resistance value. Also, a MOSFET switch has a short turn-on delay time which is the time taken to charge the input capacitance of the device before draining current conduction can start. This allows the gating grid to be opened quickly. Since the source side of the MOSFET switch defines the reference voltage of the gate signal to the switch, we connect the negative side of the gating grid to the drain connection of the P-MOSFET switch and the positive side of the gating grid to an N-MOSFET switch. Both P-MOSFET and N-MOSFET switches have the same turn-on delay time of 14 ns.

To drain charges from the gating grid as fast as possible, we need to drive the MOSFET switches at the saturated region where the internal resistance of the switches is smallest, 0.18Ω for IRF640 and 0.5Ω for IRF9640. These MOSFET switches are driven by the gate driver chips which supply the gate signal to control the operation of N- and P-switches. To achieve the saturated region of the MOSFET switches that we use, the amplitude of the TTL signals should be greater than or equal to 10 V for N-MOSFET and −10 V for P-MOSFET switches. We use a MIC4420 chip for each N-MOSFET switch and a MIC4429 chip for each P-MOSFET switch. Both of these chips can generate the voltage from 0 V to the operating voltage of ±12 V, safely below the maximum voltage of ±18 V, in 20 ns. Unlike the MOSFET switches, which are floating at the average voltage, the grounds of the MIC4420 and MIC4429 switches are referenced to an external power supplies; the outputs of these gate drivers are capacitively connected to MOSFET switches. In addition to these switches that combine to open the gating grid, there are two additional switches of the same type that are used to close the gating grid in about 3 μs, about the same time needed to recharge the capacitor to its original voltage (±12 V). Thus, four switches, two HV power supplies and one 12V supply are required to open and close the gating grid.

Figure 4:
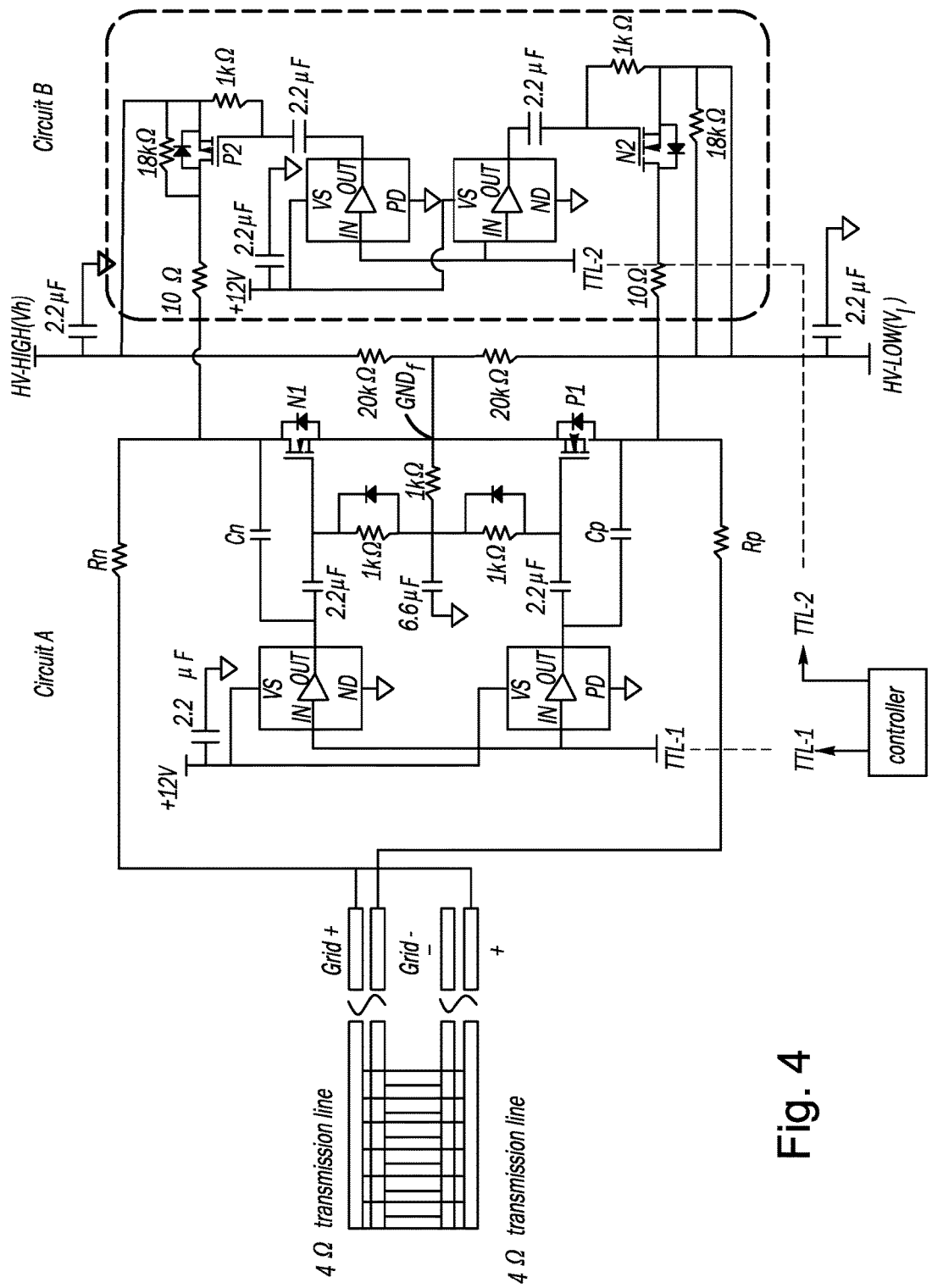
FIG. 4 is an electronic circuit diagram of the gating grid driver.

C. Operation of the Gating Grid Driver:

FIG. 4 shows the circuit diagram of a gating grid driver. The gating grid is connected to the gating grid driver via two shielded low impedance stripline transmission lines. To open the gating grid, one applies a positive TTL signal to the input connection labeled TTL-1 which closes the MOSFET switches labeled N1 and P1 on the right edge of Circuit A. Once these switches are closed, the current flows between the two sides of the gating grid until both sides reach the common voltage. The length of the TTL-1 signal defines the duration of the time that these switches remain closed. The gating grid should remain open long enough to let all the electrons from the interesting event to pass through the grid.

To close the gate, one stops the TTL-1 signal and promptly afterwards sends a TTL signal to the TTL-2 input, which then closes the two switches labeled N2 and P2. The two sides of the gating grid are connected to two high voltage supplies, labelled HV-High and HV-Low, and recharge all the wires through two 10Ω resistors shown in the figure. This is accomplished in approximately 3 μs. After 3 μs has elapsed, the N2 and P2 switches open and the voltage on the gating grid is maintained by two 18 kΩ resistors that connect the positive and negative sides of the gating grid to the HV supplies.

To avoid inducing unwanted signals on the pads when the gating grid is initially opened, the positive and negative wires of the grid must change their voltages at rates that are equal in magnitude and opposite in sign. This rate is basically given by the RC time constant τ of circuit A, where R≈R1+R2 and C is the capacitance of the gating grid and cable network.

In reality, both switches and other circuit components may have properties that may be poorly documented. More importantly, the gating grid in the environment of the TPC will be capacitively and inductively coupled to the ground plane, the anode plane and the pad plane. These couplings are specific to the design of the gating grid. Thus, we include a pair of adjusting capacitors, Cp, Cn and a pair of terminating resistors Rn and Rp associated with the N1 and P1 switches to allow some compensation of couplings that appear in the real environment of a TPC gating grid. Typically, Rn and Rp control the discharge and balance the discharge rates on the positive and negative side of the gating grid, while Cn and Cp can be adjusted to separately to balance the positive and negative charge.

III. SPICE: Circuit Analysis Program

In implementing a working circuit, in view of the component variations that can be encountered, it can be helpful to use a circuit analysis program to evaluate the active circuit parameters and to choose circuit component values, particularly components that fine-tune the capacitive and/or inductive coupling effects so that that transmission line is well matched. One such circuit analysis program is SPICE (Simulation Program with Integrated Circuit Emphasis), publicly available as open source simulation tool. The following discussion explains how the SPICE tool can be used to model the behavior of the gating grid driver circuit and ultimately to select capacitor and resistor values to match the transmission line.

Throughout this disclosure, the circuit analysis program, SPICE, is used to simulate the gating grid driver in order to understand the properties of the driver circuit, problems encountered and also to provide guidance how to tune the gating grid driver. SPICE enables DC, AC and transient analysis and can be used to check the integrity of the circuit designs and to predict the performance of a circuit. Due to its popularity, many manufacturers provide SPICE models for their electronic components to facilitate the simulation of the performance circuits made with these components. The simulations described below, were performed with the version OrCAD EE PSPICE.

To study the discharge characteristics of the MOSFET switches in our circuit, we use the SPICE model of the MOSFET switches provided by the Vishay. In the simulation, the gating grid is modeled by a capacitor of 26.5 nF, which matches the capacitance of the SπRIT TPC gating grid. FIG. 5 shows SPICE simulations of the gating grid switching from the closed configuration to the open configuration and then back to closed configuration. At the beginning of the simulations, the gating grid is closed. Thus, the alternate wires in the gating grid are biased to −40V and −180 V. A TTL1 logic signal is input to the circuit at t=0.5 μs, initiating the closing of the N- and P-MOSFET switches. It takes an additional 0.05 μs for the N1 and P1 switches to open and the voltages to begin their exponential decrease. In this circuit, there are two resistors Rp and Rn and two capacitors Cp and Cn that can be used to tune the performance of the gating grid driver.

Figure 5A:
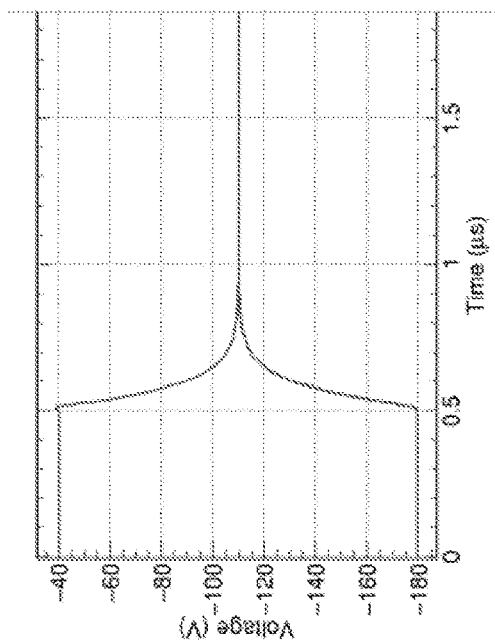
FIGS. 5a and 5b (collectively referred to as FIG. 5) are timing diagrams from SPICE calculations illustrating the gating grid voltages as a function of time during the transition from closed to open (FIG. 5a) and open to closed (FIG. 5b)
Figure 5B:
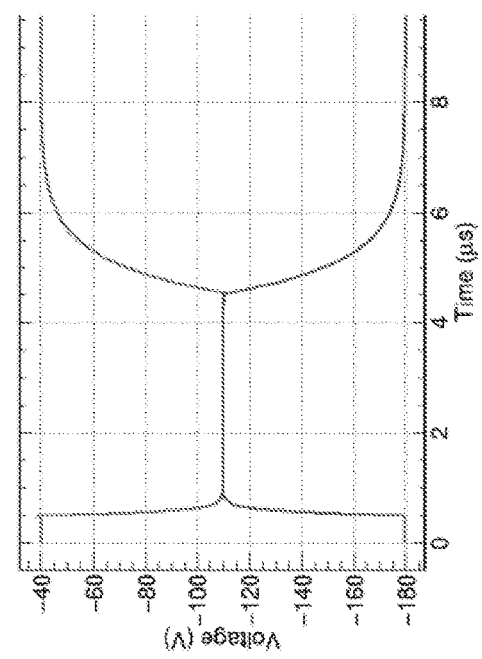

FIG. 5 shows the decrease in voltage of the gating grid for default values of Cp=Cn=100 pF and Rp=Rn=1 ohms. With these values, the gating grid reaches a common voltage of −110 V well before an additional elapsed time of 0.35 μs (FIG. 5*a*) after switches N1 and P1 open. In this particular case, TTL1 is 4 μs long. At the end of the TTL1 signal, the TTL2 signal arrives and the gating grid begins to close. After 3 μs the gating grid is recharged to the original voltages and is closed as illustrated in FIG. 5*b*.

Figure 6A:
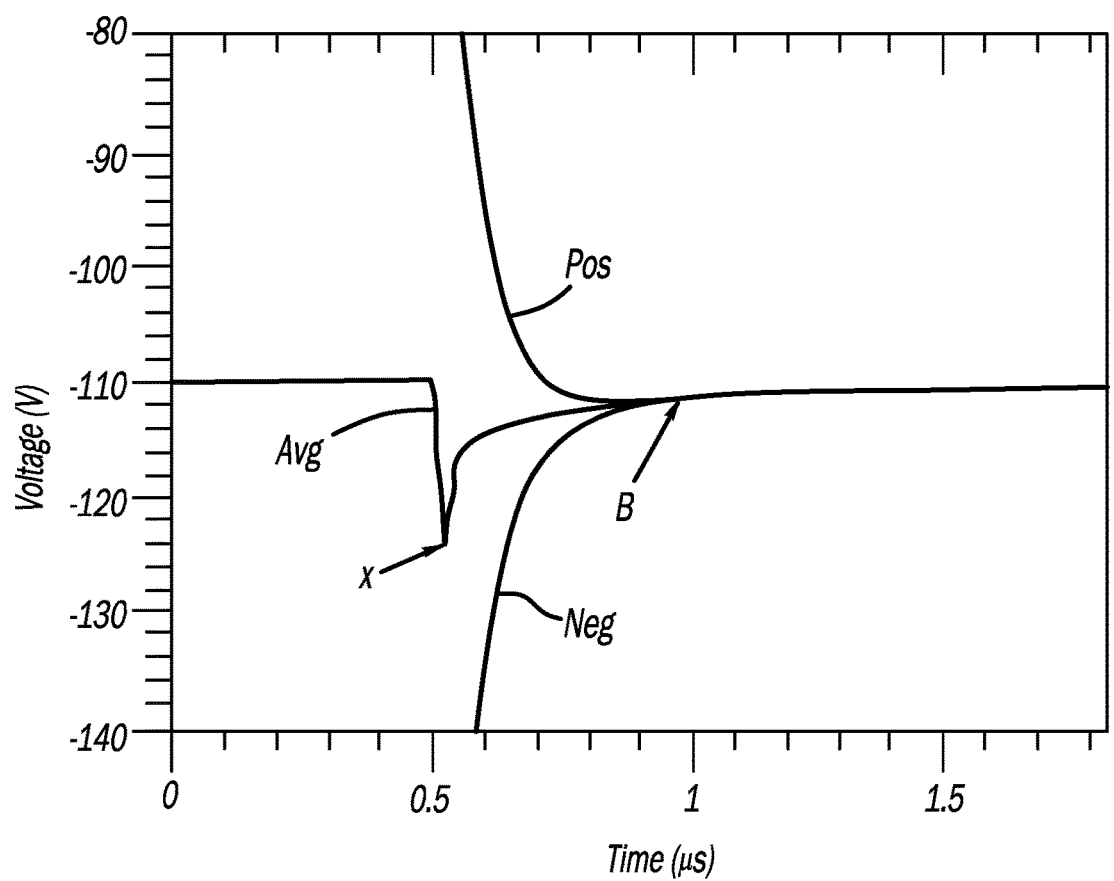
FIGS. 6a and 6b (collectively referred to as FIG. 6) illustrate examples of gating grid transition from closed to open, using different capacitive and resistive characteristics, FIG. 6a having the following capacitance and resistance values: Cp=600 pF, Cn=100 pF, Rp=0.95 ohms, Rn=1.05 ohms.
Figure 6B:
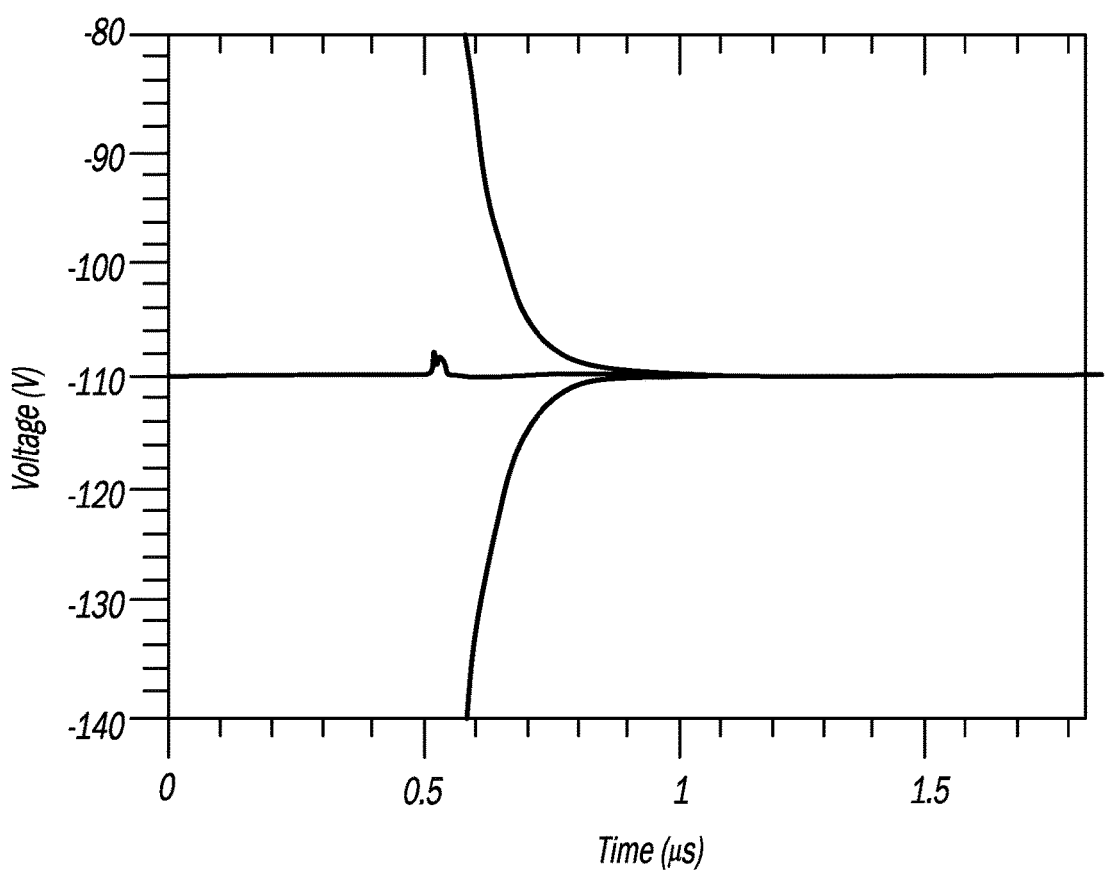

By changing the values of Cp, Cn, Rp and Rn, one can explore situations when the discharge rates of the positive and negative sides of the gating grid are not the same. FIG. 6*a* shows the calculated voltages on the more positive (Pos) and negative (Neg) sides of the gating grid and their average (Avg) on an expanded scale that focuses on the opening of the gating grid. These calculations were performed for Cp=600 pF, Cn=100 pF and Rp=0.95 ohms, Rn=1.05 ohms. For illustration, we choose Cp>>Cn to represent some aspect of the fabrication in which one side of the gating grid has a stronger capacitive coupling to the ground plane or to the TPC ground than does the other side, which might occur due to some space requirement imposed by the geometry of the TPC or its cabling. The average (Avg) signal shows this asymmetry introduces a significant asymmetry in the average voltage obtained by adding the positive and negative voltages. This average voltage, $V_x$=−122.3 V, is 12.3 V lower than the average voltage of $V_a$=−110 V at the minimum at a point labeled X and located at 0.55 μs. Beyond X, the difference between the voltages on the two sides of the gating grid vanishes. This point, labeled B located at t=0.9 μs in the figure provides the average voltage right after the gating grid is fully open. At B, the sum of the voltages is $V_B$=−112.2 V which is 2.2V below the average voltage of −110 V.

Figure 7A:
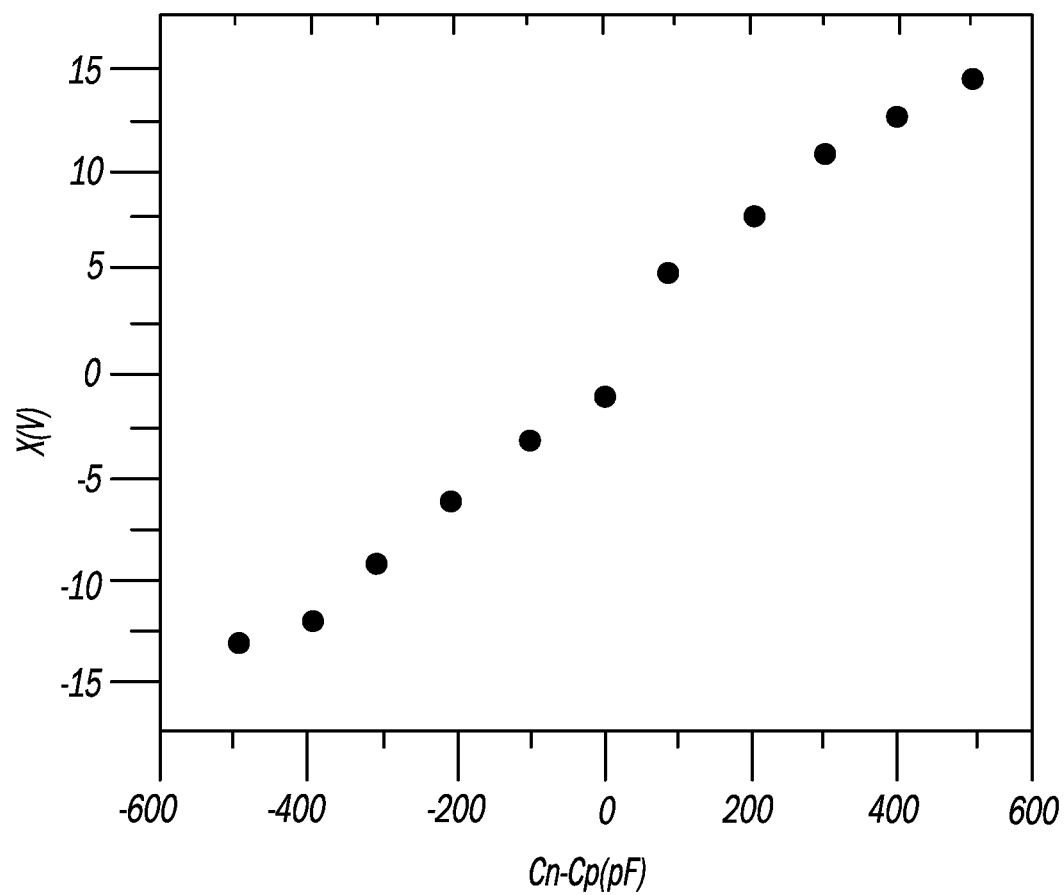
FIGS. 7a and 7b (collectively referred to as FIG. 7) are graphs illustrating the dependence of V and B values on the difference of the values of Cn and Cp.
Figure 7B:
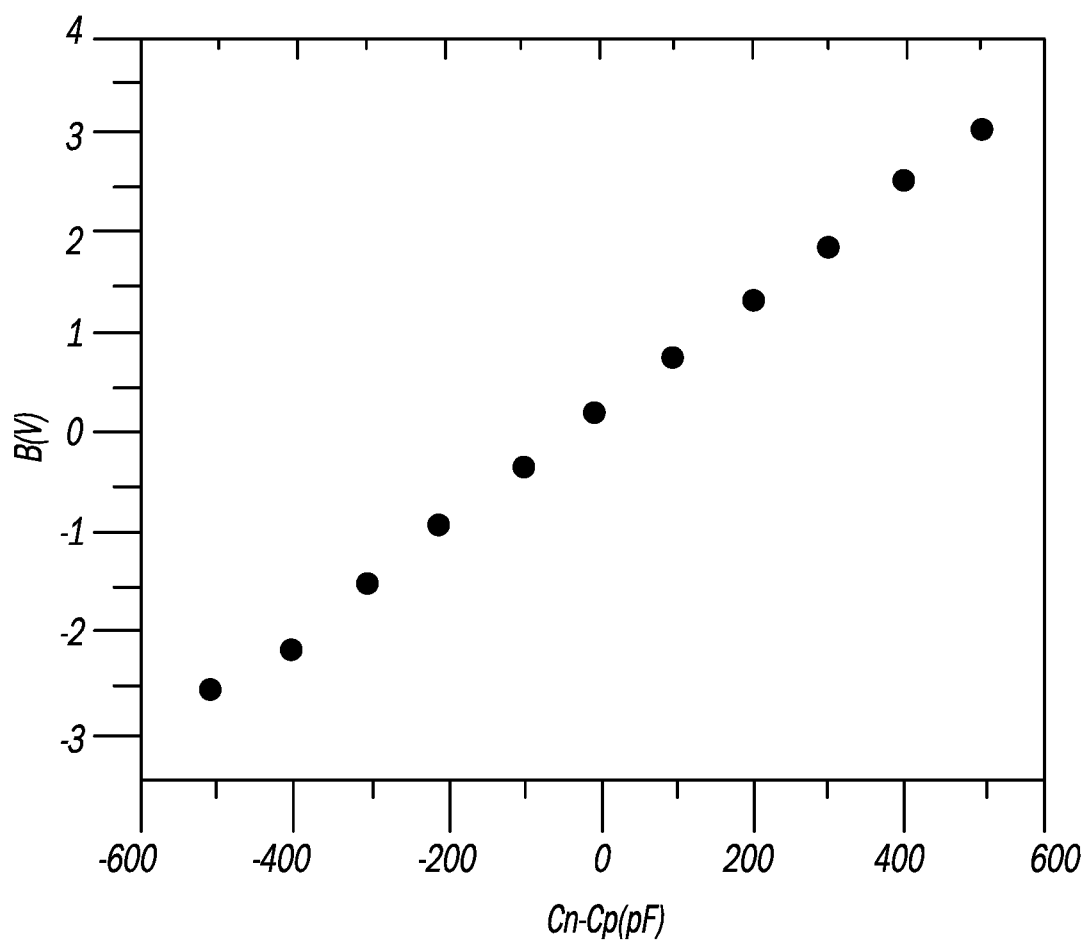

To show how one can minimize this offset, we vary the values of Cn and Cp listed in Table 2. Shown in FIG. 7 are the dependence of X and B as a function of (Cp-Cn). We see that one can shift these offsets at X and B by increasing Cn. As expected the best configuration is when Cn is comparable to Cp. One can approximately cancel the effect of the large value of Cp=600 pF by balancing it with a comparably large value of Cn=600 pF. The result is very similar to that for the default values of Cp=Cn=100 pF and Rp=0.95 ohms, Rn=1.05 ohms. FIG. 7*b* compares the gating grid performance Cp=Cn=600 pF to that for Cp=Cn=100 pF. In both cases, the discharge rate is now nearly symmetric and both the X and B values are much smaller as shown in Table 2. If the electronics of the TPC can allow partial readout with a user defined threshold, it is possible to use offset values for Cp or Cn to shift the noise spectrum to the opposite polarity as the ionization signals for the real events, which could allow self-triggering of the electronics at lower effective thresholds.

TABLE 2

List of Cn, Cp, Rn and Rp values used in SPICE calculations

| Cp (pF) | Cn (pF) | ΔC = Cn − Cp (pF) | X (V) | B (V) |
|---|---|---|---|---|
| 100 | 100 | 0 | −1 | 0.1 |
| 200 | 100 | −100 | −3 | −0.32 |
| 300 | 100 | −200 | −6 | −0.74 |
| 400 | 100 | −300 | −9 | −1.16 |
| 500 | 100 | −400 | −12 | −1.6 |
| 600 | 100 | −500 | −13.5 | −2 |
| 100 | 200 | 100 | 4.84 | 0.52 |
| 100 | 300 | 200 | 7.6 | 0.95 |
| 100 | 400 | 300 | 10.65 | 1.4 |
| 100 | 500 | 400 | 12.78 | 1.86 |
| 100 | 600 | 500 | 14.47 | 2.34 |

IV. Relationship Between Transmission Line and Gating Grid Driver

The disclosed gating grid driver circuit is able to open the gate quickly, and without inducing significant noise that would otherwise disturb the detectors. As discussed above, the circuit operates to quickly remove the voltage difference between the positive and negative grid wires, by shorting them together, allowing the voltage difference between the charged positive and negative wires to quickly seek a common potential corresponding to the floating ground shared between them. We estimate that with each microsecond taken to open the gating grid, the detectors lose approximately 5 cm of detector information (information that is lost because the grid has not yet opened). Thus fast operation to open the gate is extremely important in this application.

Conventional gating circuits attempt to achieve fast operation by driving the respective positive and negative grids to a common "gate open" voltage by applying bursts of power supply energy at extremely fast rise times. This burst of energy causes unwanted overshoot that must then be compensated for by applying wave shaping techniques to the delivered energy. Not only are these fast rise time energy bursts difficult to wave shape and control, they also inject noise into the sensitive detector equipment.

In contrast, by shorting the respective positive and negative grid wires together, the disclosed gating grid driver circuit creates a passive short circuit path between the grids. Thus reliance on active application of fast rise time energy bursts is avoided. The disclosed gating grid driver circuit is able to achieve its very fast performance, in part, due to the careful match between the MOSFET switches and the carefully chosen 4 ohm transmission line. In this regard, all transmission lines exhibit some reactance, e.g., distributed capacitance and/or distributed inductance, in addition to the distributed resistance of the line. The transmission line physics are such that the distributed reactance, particularly the distributed capacitance, establishes an RC time constant, giving each transmission line a natural speed at which imposed voltages can rise or fall.

Conventional gating circuits use a standard 50 ohm transmission line, as such is common across many industries for transmission of signals at speeds into the VHF-UHF regime. However, at the required nanosecond speeds with which the TPC equipment operates, the time constant imposed by a 50 ohm transmission line is quite long and responsiveness suffers. In contrast, the present gating grid driver circuit is matched to a 4 ohm transmission line. One significant benefit is that the 4 ohm transmission line has much smaller RC time constant, resulting in a natural operating speed that is much faster than the conventional 50 ohm line.

In order to operate with the 4 ohm transmission line, the MOSFET switching circuit, comprising MOSFETs N1 and P,1 is carefully matched to the 4 ohm transmission line by selecting resistors Rn and Rp, and capacitors Cn and Cp so that a 1:1 VSWR match between the switching circuit and the transmission line load is achieved, as closely as practicable. In performing this matching, the MOSFET equivalent circuits are preferably considered, because the respective N-MOSFET and P-MOSFET devices may not be fully symmetrical (and likely are not). However, once the values of Rn, Rp, Cn, and Cp are chosen, the respective positive and negative driver circuits are each matched to its 4 ohm transmission line component and the floating ground $GND_f$ (FIG. 4) is symmetrically balanced between the positive and negative circuits. Note that the respective MOSFET devices driven by driver circuits, such as MIC4429 devices, are coupled through 2.2 microfarad capacitors, thus isolating the driver circuits and their 12 volt power supply ground from the floating ground $GND_f$.

Figure 8:
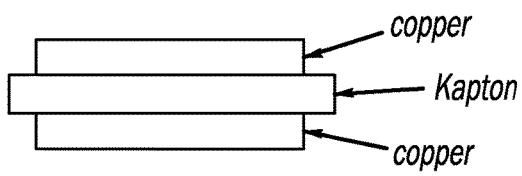
FIG. 8 illustrates an exemplary transmission line construction, usable with the disclosed gating grid driver circuit.

While other transmission line configurations are possible, the preferred embodiment uses a 4 ohm transmission line constructed of parallel aluminum strips, 6 mm across, separated by a thin insulator at the mathematically determined spacing to achieve a 4 ohm impedance. It is important that the insulator be of a material that does not interact with the gasses contained within the field cage of the TPC. Because the chosen insulator material can affect the permeability and/or permittivity of the operative space surrounding the transmission line, this choice of material has an effect on the reactance of the transmission line, and thus has an effect on how the Cn and Cp values are chosen to achieve proper match. FIG. 8 shows a presently preferred transmission line assembly in cross-section. There are two transmission lines with 4 ohm impedance added to the gating grid section on each side of the pad plane. The part of the transmission line that is inside the chamber should be carefully made to ensure that the cable fits in the narrow channel in the TPC. The transmission line is made with two ¼ inch wide, 1.4 mil thick Cu ribbons separated by 1 mil of Kapton as shown in FIG. 8. The cable is then encapsulated in EZpoxy 83 to prevent emission of contaminants from the cable into the counter gas.

By achieving a careful match between the 4 ohm transmission line and the MOSFET switching circuit, several benefits are achieved. First, by cancelling out the distributed capacitance in the transmission line, energy can flow between the lines when shorted with maximum efficiency and without creating reflections as the voltages stabilize to the floating reference level. Second, by being properly matched, the tendency to introduce noise into the detectors is greatly reduced. Switching noise produced by the active components (the MIC4429 drivers and MOSFETs) is less able to couple into the transmission line.

V. Summary and Conclusion

A gating grid driver for use with radiation detectors and other similar devices that require a gating grid that operates in a bipolar mode with different electrostatic potentials on alternating wires is presented here. To open such gating grids, the driver shorts the alternate wires to a common voltage $V_a$. Later, this driver closes the grid by restoring the voltage differences in the adjacent wires. The circuit consists of 2 pairs of N- and P-MOSFET switches and includes two adjustable capacitors and resistors that can be used to adjust the opening time, and shift the balance of positive and negative charge for individual radiation detector. By achieving a careful match between a low impedance transmission line and the switching circuit, the driver circuit opens the gating grid in 0.35 μs, minimizing the lost drift length associated with this opening time.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A gating circuit for respectively driving the positive and negative gating grids of a radiation detector, comprising:
   a first electronically actuated switch having a first terminal adapted to be coupled to the positive gating grid and a second terminal adapted to be coupled to the negative gating grid;

the first electronically actuated switch having a first switching state in which the positive and negative gating grids are decoupled from one another, and having a second switching state in which the positive and negative gating grids are shorted together;

a voltage supply circuit providing a first voltage source producing a predetermined voltage above a predetermined reference voltage, and providing a second voltage source producing a predetermined voltage below the predetermined reference voltage;

a second electronically actuated switch having a third terminal adapted to be coupled to the positive gating grid and a fourth terminal adapted to be coupled to the negative gating grid and being coupled to the voltage supply circuit;

the second electronically actuated switch having a third switching state in which the positive and negative gating grids are decoupled from the voltage supply circuit and having a fourth switching state in which the positive grid is coupled to the first voltage source and in which the negative grid is coupled to the second voltage source;

a controller coupled to the first and second electronically actuated switches that selectively:
(a) places the first electronically actuated switch in the second state while concurrently placing the second electronically actuated switch in the third state, to open the gating grids of the radiation detector; and
(b) places the first electronically actuated switch in the first state and placing the second electronically actuated switch in the fourth state, to close the gating grids of the radiation detector.

2. The circuit of claim 1 wherein the first switching circuit comprises a tandem pair of MOSFET transistors.

3. The circuit of claim 1 wherein the first switching circuit comprises an N-MOSFET transistor and a P-MOSFET transistor.

4. The circuit of claim 1 wherein the second switching circuit comprises a tandem pair of MOSFET transistors.

5. The circuit of claim 1 wherein the second switching circuit comprises an N-MOSFET transistor and a P-MOSFET transistor.

6. The circuit of claim 1 wherein the first and second switching circuits mutually coupled to float at an average ground.

7. The circuit of claim 1 further comprising an external power supply, and wherein the first and second switching circuits each comprises a tandem pair of MOSFET transistors that are mutually coupled to float at an average ground, and wherein the MOSFET transistors are activated by switching circuits that are referenced to the external power supply.

8. A gating circuit for respectively driving the positive and negative gating grids of a radiation detector, comprising:
an electronically actuated switch having a first terminal adapted to be coupled to the positive gating grid and a second terminal adapted to be coupled to the negative gating grid;
the electronically actuated switch having a first switching state in which the positive and negative gating grids are decoupled from one another, and having a second switching state in which the positive and negative gating grids are shorted together;
a power supply circuit switchably coupled to the positive and negative gating grids, having a third switching state in which the power supply circuit is decoupled from the positive and negative gating grids and having a fourth switching state in which the power supply circuit is coupled to charge the positive and negative gating grids;
a controller coupled to the electronically actuated switch and to the power supply circuit that selectively:
(a) places the electronically actuated switch in the second state while concurrently placing the power supply circuit in the third state, to open the gating grids of the radiation detector; and
(b) places the electronically actuated switch in the first state and places the power supply circuit in the fourth state, to close the gating grids of the radiation detector.

9. The gating circuit of claim 1 wherein the radiation detector is a time projection chamber.

10. The gating circuit of claim 8 wherein the radiation detector is a time projection chamber.

11. A gating device for radiation detectors comprising:
a bipolar gating grid defined by spaced apart wires defining alternating pairs of positive and negative charge carrying wires;
a transmission line system defining a first transmission line coupled to the positive charge carrying wires and a second transmission line coupled to the negative charge carrying wires;
a controller circuit that supplies timing signals;
a power supply responsive to the controller circuit and coupled through the transmission line system to the spaced apart wires and operable to apply positive and negative charges to the respective positive and negative charge carrying wires;
a gating circuit responsive to the controller circuit and coupled through the transmission line system to the spaced apart wires and configured to short together the positive and negative charge carrying wires to substantially neutralize the positive and negative charges on the respective positive and negative charge carrying wires.

12. The gating device of claim 11 wherein the gating circuit comprises a first switching circuit coupled to the first transmission line though a first impedance coupling and a second switching circuit coupled to the second transmission line through a second impedance coupling, wherein the first and second impedance couplings are each tuned to substantially match the impedances of the respective first and second transmission lines.

13. The gating device of claim 12 wherein the first and second impedance couplings are matched to achieve a standing wave ratio of substantially 1:1 in each of the first and second transmission lines.

14. The gating device of claim 11 wherein the gating circuit comprises a first tandem pair of MOSFET transistors coupled to the first transmission line though a first impedance coupling and a second tandem pair of MOSFET transistors coupled to the second transmission line through a second impedance coupling, wherein the first and second impedance couplings are each tuned to substantially match the impedances of the respective first and second transmission lines taking into account the inherent reactance of the first and second tandem pairs of MOSFET transistors.

15. The gating device of claim 11 wherein the first and second transmission lines each exhibit an impedance of nominally 4 ohms.

16. The gating device of claim 11 wherein the first and second transmission lines each comprise stripline.

17. The gating device of claim 11 wherein the first and second transmission lines each comprise conductive ribbons separated by an insulator that defines a spacing selected to achieve a nominal transmission line impedance of 4 ohms.

* * * * *